(12) United States Patent
Ballantine et al.

(10) Patent No.: US 6,580,140 B1
(45) Date of Patent: Jun. 17, 2003

(54) METAL OXIDE TEMPERATURE MONITOR

(75) Inventors: Arne W. Ballantine, Cold Spring, NY (US); Edward C. Cooney, III, Jericho, VT (US); Jeffrey D. Gilbert, South Burlington, VT (US); Robert G. Miller, Essex Junction, VT (US); Amy L. Myrick, Waterbury Ctr., CT (US); Ronald A. Warren, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 09/665,584

(22) Filed: Sep. 18, 2000

(51) Int. Cl.$^7$ .................. H01L 31/058; H01L 23/58
(52) U.S. Cl. .................. 257/467; 257/43; 257/48; 257/751
(58) Field of Search .................. 257/43, 48, 467, 257/751, 767

(56) References Cited

U.S. PATENT DOCUMENTS

| | | | |
|---|---|---|---|
| 4,764,026 A | 8/1988 | Powell et al. | 374/178 |
| 5,160,912 A | 11/1992 | Burke et al. | 338/22 R |
| 5,242,225 A | 9/1993 | Kasanami et al. | 374/185 |
| 5,436,494 A | 7/1995 | Moslehi | 257/467 |
| 5,633,121 A | 5/1997 | Namiki et al. | 430/313 |
| 5,772,328 A | 6/1998 | Kronberg | 374/162 |
| 5,967,661 A | 10/1999 | Renken et al. | 374/126 |
| 6,200,023 B1 * | 3/2001 | Tay et al. | 374/161 |
| 6,359,263 B2 * | 3/2002 | Tay et al. | 219/411 |

* cited by examiner

Primary Examiner—Minh Loan Tran
(74) Attorney, Agent, or Firm—Schmeiser, Olsen & Watts; William D. Sabo

(57) ABSTRACT

A method, and associated structure, for monitoring temperature and temperature distributions in a heating chamber for a temperature range of 200 to 600° C., wherein the heating chamber may be used in the fabrication of a semiconductor device. A copper layer is deposited over a surface of a semiconductor wafer. Next, the wafer is heated in an ambient oxygen atmosphere to a temperature in the range of 200–600° C. The heating of the wafer oxidizes a portion of the copper layer, which generates an oxide layer. After being heated, the wafer is removed and a sheet resistance is measured at points on the wafer surface. Since the local sheet resistance is a function of the local thickness of the oxide layer, a spatial distribution of sheet resistance over the wafer surface reflects a distribution of wafer temperature across the wafer surface during the heating of the wafer. The measured spatial distribution of sheet resistance may be utilized to readjust the spatial distribution of heat input to another wafer in order to achieve a more uniform temperature across the other wafer's surface. In addition, the monitor may be reconditioned for repeated use by heating the monitor in a hydrogen ambient environment to convert the oxide layer to unoxidized copper. Additionally, the oxide layer has a color that is a function of the oxide layer thickness, where the color may be used to estimate the temperature at which the wafer was heated in the ambient oxygen atmosphere.

15 Claims, 5 Drawing Sheets

METAL OXIDE TEMPERATURE MONITOR

BACKGROUND OF THE INVENTION

1. Technical Field

The present invention relates to a method, and associated structure, for monitoring temperature and temperature distributions in a heating chamber for a temperature range of 200 to 600° C., wherein the heating chamber may be used in the fabrication of a semiconductor device.

2. Related Art

Annealing (i.e., heating) a semiconductor wafer at a uniform temperature in a range of 200 to 600° C. may be required in a process that fabricates a semiconductor device. In order to ensure that a heating chamber used for the annealing is at the desired uniform temperature, particularly at a local space within the heating chamber at which the semiconductor wafer is positioned, it is necessary to monitor the temperature distribution within the local space of the heating chamber.

There are currently two methods of externally monitoring and calibrating temperature control tools used in the annealing. The first technique employs a monitor having a known thermocouple standard. However, this monitor is difficult to use, time consuming and expensive. Furthermore, this monitor indicates the temperature at only a few isolated locations on the wafer. The second temperature monitoring technique uses a second wafer to indicate the temperature across the entire surface of the wafer being fabricated. Currently, there are thermal oxide wafers that are sensitive in a range of about 800° C. to about 1200° C. There are also activation monitors implanted with n-type or p-type dopants which are sensitive in a range of about 850° C. to about 1100° C. Similarly, titanium monitors, which are sputtered with titanium (Ti) and annealed to form TiSi, have a sensitivity in a range of about 650° C. to about 750° C. Likewise, cobalt (Co) monitors exhibit a sensitivity in a range of about 530° C. to about 575° C.

Unfortunately, there are no existing temperature monitors having a temperature sensitivity within the range of about 200° C. to about 600° C. In addition, many of the techniques currently used to monitor annealing temperatures are expensive, time consuming, and difficult to use. Furthermore, none of the above mentioned techniques, with the exception of the thermal oxide monitor, can be reused repeatedly.

Accordingly, there exists a need for a temperature monitoring device for temperatures in the range of about 200° C. to about 600° C., as well as a need for reconditioning such monitors for repeated usage.

Summary of the Invention

The present invention provides a temperature monitoring wafer, comprising:
  a substrate;
  a conductive layer coupled to the substrate, wherein the conductive layer includes a conductive material that will oxidize to form a layer of oxide when the conductive material is at a temperature in a temperature range of about 200° C. to about and in an oxidizing environment that comprises an oxidizer of sufficient concentration to oxidize a portion of the conductive layer such that the layer of oxide is formed, and wherein said layer of oxide is utilizable for said temperature monitoring.

The present invention provides a method of fabricating a temperature monitoring wafer, comprising the steps of:
  providing a substrate; and
  forming a conductive layer on the substrate, wherein the conductive layer includes a conductive material that will oxidize to form an oxide layer when the conductive material is at a temperature in a temperature range of about 200° C. to about 600° C. and in an oxidizing environment that comprises an oxidizer of sufficient concentration to oxidize a portion of the conductive layer such that the oxide layer is formed, and wherein said oxide layer is utilizable for said temperature monitoring.

The present invention provides a method of fabricating a temperature monitoring wafer, comprising the steps of:
  providing a substrate;
  forming a diffusion barrier layer on the substrate, wherein the diffusion barrier layer inhibits diffusion of a conductive material into the substrate from a conductive layer when the wafer is at a first temperature in a temperature range of about 200° C. to about 600° C., and wherein the substrate inhibits diffusion of material from the substrate into the conductive layer when the wafer is at a second temperature in the temperature range, and wherein the first temperature and the second temperature are equal or unequal.; and
  forming the conductive layer on the diffusion barrier layer, wherein the conductive layer includes a conductive material that will oxidize to form an oxide layer when the conductive material is at a temperature in the temperature range and in an oxidizing environment that comprises an oxidizer of sufficient concentration to oxidize a portion of the conductive layer such that the oxide layer is formed, said oxide layer utilizable for said temperature monitoring.

The present invention provides a temperature monitoring device to accurately monitor a temperature distribution in a heating chamber in a 200° C. to 600° C. temperature range. The present invention also provides a method for reconditioning the temperature monitor for repeated usage. Additionally, the temperature monitor is reliable, easy to use, and inexpensive to fabricate.

DETAILED DESCRIPTION OF THE INVENTION

Figure 1:
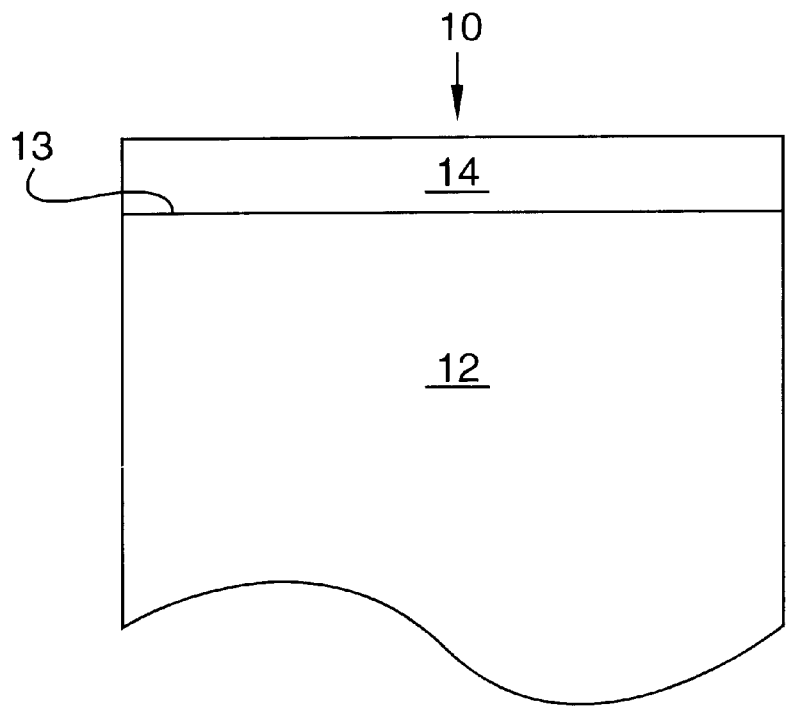
FIG. 1 depicts a front cross-sectional view of a semiconductor wafer having a diffusion barrier on a substrate, in accordance with an embodiment of the present invention.

FIG. 1 illustrates a cross-sectional view of a semiconductor wafer 10 having a substrate 12, in accordance with an embodiment of the present invention. The wafer 10 is a "test wafer" which, after several process steps, will serve as a temperature monitor for determining temperature inhomogeneities in a heating chamber, as will be described infra. In the context of the present invention, a temperature monitor is a device that is capable of monitoring temperature and temperature distributions (i.e., spatial variations in temperature) within a local space inside a heating chamber. The substrate 12 includes a non-conductive material and may have a same composition that a "production wafer" would have, wherein a production wafer is a wafer that is processed in the heating chamber in conjunction with a real application such as a fabrication of a semiconductor device. Accordingly, the substrate 12 may include a semiconductor material that is doped with n-type material (e.g., arsenic, phosphorus, bismuth, lead), doped with p-type material (e.g., boron, indium, gallium), or not doped. The semiconductor material may include silicon, but may alternatively include other semiconductor substances such as gallium arsenide or germanium. Note that an effectiveness of the wafer 10 as a test monitor is insensitive to the material comprised by the substrate 12. Accordingly, the substrate 12 may include any material that is sufficiently insulative.

A diffusion barrier layer 14 may be deposited on a surface 13 of the substrate 12, using conventional deposition techniques. The diffusion barrier layer 14 serves to prevent a diffusion of conductive material from a conductive layer (see infra FIG. 2 and accompanying discussion) of the wafer 10 into the substrate 12 when the wafer 10 is at a temperature between about 200° C. and about 600° C. The diffusion barrier layer 14 also serves to prevent a diffusion of material (e.g., silicon) from the substrate 12 into said conductive layer when the wafer 10 is at a temperature between about 200° C. and about 600° C. Note that the aforementioned conductive layer is a conductive layer 16 that will be formed in a subsequent process step, as discussed infra in conjunction with FIG. 2. Said diffusion may cause variability of temperature monitoring measurements using the wafer 10, which is undesirable. The diffusion barrier layer 14 may include a diffusion-blocking constituent such as tantalum nitride ($Ta_2N$) or silicon nitride ($Si_3N_4$); however, other materials may also be used that are capable of preventing the diffusion. The diffusion barrier layer 14 generally has a thickness greater than about 20 angstroms (Å), and preferably between about 100 Å and about 500 Å.

Figure 2:
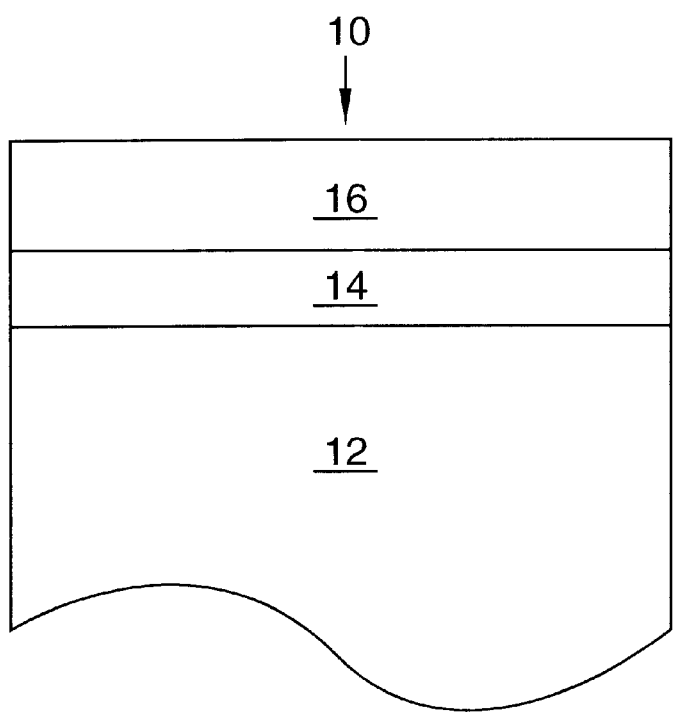
FIG. 2 depicts the wafer FIG. 1 after a conductive layer has been formed on the diffusion barrier.

FIG. 2 illustrates the wafer 10 of FIG. 1 after the conductive layer 16 has been formed on the diffusion barrier 14, wherein the conductive layer 16 includes the conductive material. The conductive layer 16 may be formed by any method known to one of ordinary skill, such as by being deposited on the diffusion barrier layer 14 using conventional deposition techniques such as sputtering. The conductive layer 16 may include, inter alia, copper. However, the conductive layer 16 may comprise other conductive materials, including such metals as aluminum, platinum, tungsten, titanium, and cobalt. The conductive layer 16 has a thickness between about 100 Å and about 1500 Å, and preferably about 600 Å. If the diffusion barrier layer 14 is absent, then the conductive layer 16 is formed directly on the substrate 12 by any method known to one of ordinary skill, such as by being deposited on the substrate 12 using conventional deposition techniques such as sputtering. Thus, the conductive layer 16 is generally coupled to the substrate 12, with or without the diffusion barrier layer 14.

Figure 3:
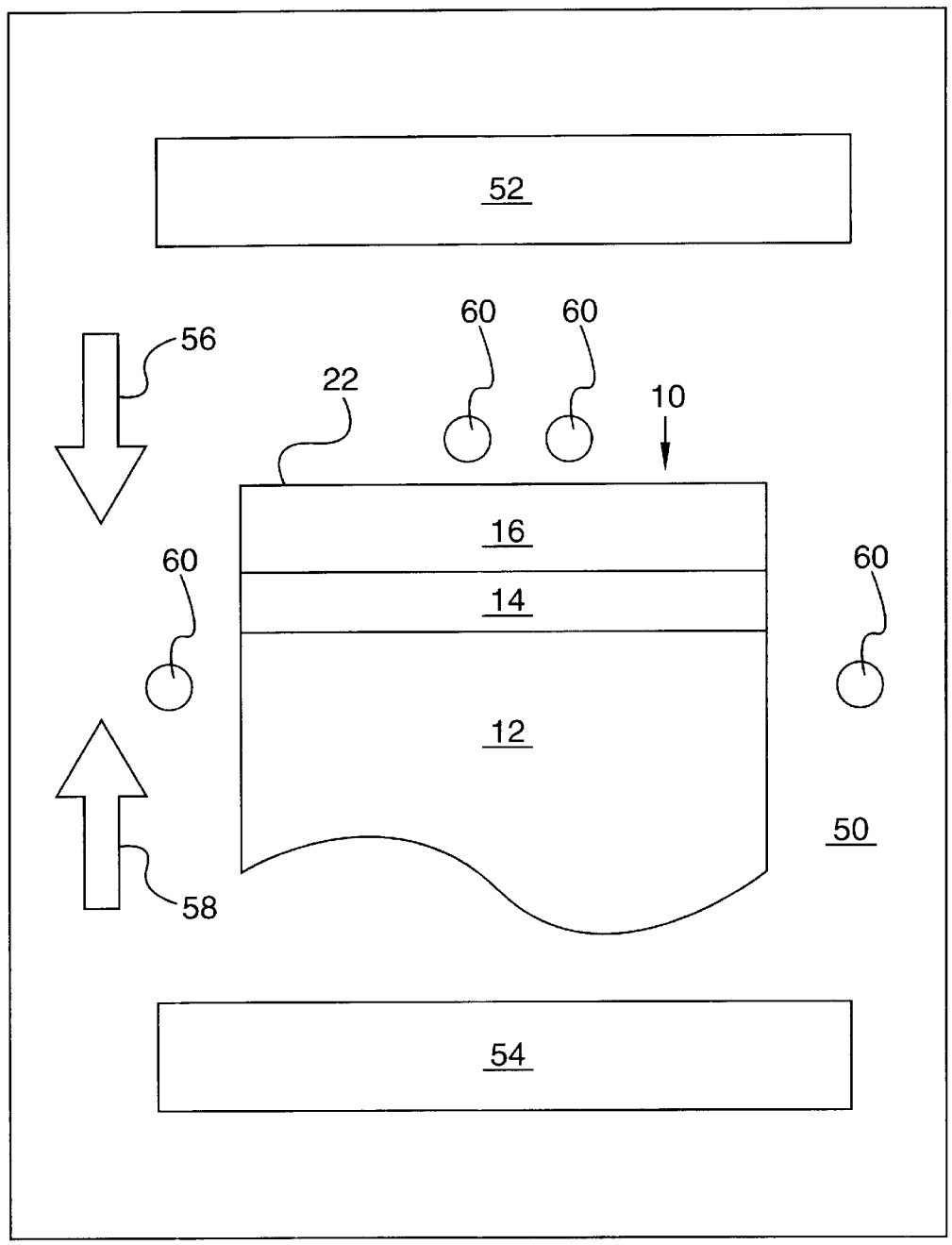
FIG. 3 depicts the wafer of FIG. 2 under temperature elevation in a heating chamber.

FIG. 3 illustrates the wafer 10 of FIG. 2 being heated in a heating chamber 50 at a heating temperature between about 200° C. and about 600° C. in an oxygen ambient atmosphere. Generally, the oxygen concentration in the oxygen ambient atmosphere should be sufficient to oxidize a portion of the conductive layer 16 such that a layer of oxide is formed. The sufficient concentration of oxygen for forming the layer of oxide depends on the conductive material (or materials) of the conductive layer 16 as well as on other parameters such as the heating temperature and time of exposure to the heating temperature. A representative sufficient concentration of oxygen corresponds to an oxygen partial pressure of about 1 Torr. The oxygen gas 60 of the oxygen ambient atmosphere may be non-flowing in the form of a volumetric distribution within the heating chamber 50. Alternatively, the oxygen gas 60 of the oxygen ambient atmosphere may be in a flowing form at low flow, wherein said oxygen flow contacts the wafer 10. Since the flowing oxygen gas 60 originates from a source that is likely to be substantially cooler than the heating temperature, the oxygen flow rate should be sufficiently slow as to minimize or substantially eliminate heat transfer from the wafer 10 to the flowing oxygen gas 60. Such inhibition of heat transfer may by any method known to one of ordinary skill in the art. One such method is for the oxygen flow to be slow enough that the dominant mode of said heat transfer is by natural convection rather than by forced convection. As an additional alternative, the oxygen gas 60 of the oxygen ambient atmosphere may be primarily in a non-flowing form with supplementary flowing oxygen (at sufficiently low flow as discussed supra) replenishing oxygen gas 60 that is dynamically lost from the heating chamber 50. Another alternative, using flowing oxygen, includes preheating the flowing oxygen gas 60 to a temperature sufficiently close to the heating temperature that said heat transfer is negligible even if said heat transfer occurs by forced convection.

The ambient oxygen environment serves to oxidize a portion of the conductive layer 16 for temperature monitoring purposes, as will be discussed infra. While the embodiments described herein utilize a heated oxygen atmosphere, the scope of the present invention includes any oxidizer (e.g., heated oxygen) whose concentration is sufficient to oxidize a portion of the conductive layer 16 such that a layer of oxide is formed. Other oxidizers that may be used include, inter alia, gases such as nitrous oxide, nitric oxide, ammonia, and ozone. Alternatively, the layer of oxide may be formed by directing a plasma (e.g., ionic oxygen) onto the conductive layer 16.

The wafer 10 is a "test wafer" whose purpose is to facilitate a determination of heat source settings within the heating chamber 50 such that a uniform temperature in the heating chamber 50 will be achieved when a "production wafer" is subsequently placed within the heating chamber 50 for any purpose, such as for growing a film, or depositing a layer of material on a surface of the production wafer. In particular, the present invention determines heating settings for the heating chamber 50 that will generate a uniform temperature distribution across the test wafer 10, and subsequently across a production wafer. Thus, the aforementioned heat settings derived for the test wafers may subsequently be used in a production environment with production wafers.

The heating chamber 50 in FIG. 3 includes any volumetric enclosure capable of heating an object placed therein. The heating chamber 50 may be, inter alia, a rapid thermal processing (RTP) tool, a plasma enhanced chemical vapor deposition (PECVD) anneal tool, a silicon valley group (SVG) furnace anneal tool, a physical vapor deposition (PVD) degassing tool, etc. The heat within the heating chamber 50 may be directed toward the wafer 10 in the direction 56 from a heat source 52 above the wafer 10. The heat within the heating chamber 50 may also be directed toward the wafer 10 in the direction 58 from a heat source 54 below the wafer 10. Either or both of the heat sources 52 and 54 may be utilized in the heating chamber 50. Either or both of the heat sources 52 and 54 may be a continuous heat source or a distributed array of discrete heat sources such as a distributed array of incandescent bulbs. Alternatively, the heating chamber 50 may be a furnace.

Any method of achieving the aforementioned heating temperature in the heating chamber 50 is within the scope of the present invention. For example, with the heating chamber 50 being an RTP heating chamber, the wafer 10 could be inserted into the heating chamber 50 when the heating chamber 50 is at ambient room temperature, followed by a rapid ramping up of temperature within the heating chamber 50, such as ramping at a rate between about 50° C./sec and about 100° C./sec, until the desired heating temperature is achieved therein. The heating temperature within the heating chamber 50 should be measured at a spatial point in the heating chamber 50 near the wafer 10 and preferably as close as possible to the wafer 10. Note that the heating temperature may deviate in uniformity across a surface 22 of the wafer 10.

Figure 4:
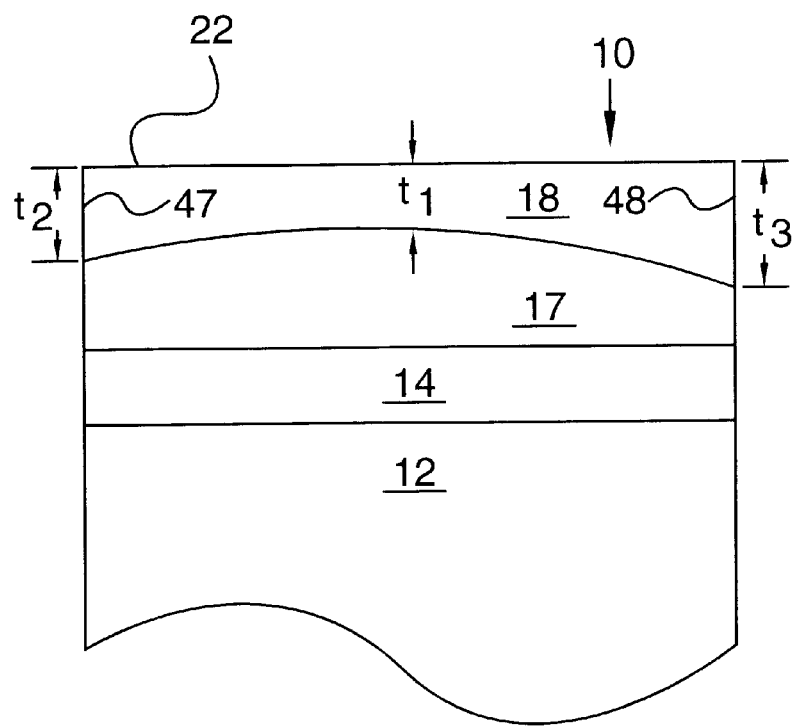
FIG. 4 depicts the wafer FIG. 3 after a top portion of the conductive layer has been transformed into an oxide layer having a nonuniform thickness.
Figure 5:
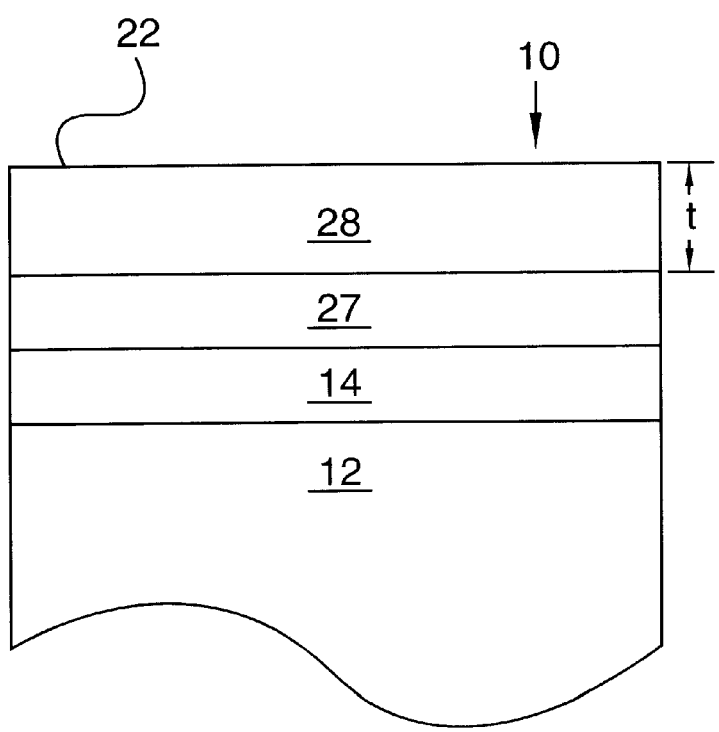
FIG. 5 depicts the wafer FIG. 3 after a top portion of the conductive layer has been transformed into an oxide layer having a uniform thickness.

The heating of the wafer 10 in the heating chamber 50 causes an oxygen-exposed upper portion of the conductive layer 16 to oxidize and form an oxide layer 18 shown in FIG. 4, wherein the oxide layer 18 includes an oxide of the conductive material of the conductive layer 16. Accordingly, the heating of the wafer 10 transforms the conductive layer 16 into the oxide layer 18 and a remaining conductive layer 17 having the conductive material. The rate of oxidation depends upon the temperature to which the wafer 10 is exposed. Accordingly, FIG. 4 shows the oxide layer 18 as having a variable thickness as a consequence of a spatially varying temperature across the surface 22 of the wafer 10 during the heating of the wafer 10 in the heating chamber 50. In FIG. 4, the oxide layer 18 has a nonuniform thickness as illustrated by thicknesses $t_1$, $t_2$, and $t_3$ at an interior location, at an edge 47, and at an edge 48 of the wafer 10, respectively, wherein $t_1$, $t_2$, and $t_3$ have different magnitudes. As will be explained infra, the present invention exploits the aforementioned variable thickness of the oxide layer 18 to make adjustments in the spatial distribution of heat generation within the heating chamber 50 (see FIG. 3) to subsequently achieve a uniform heating temperature across the surface 22 of the wafer 10. Thus the wafer 10 serves as a temperature monitor of the present invention. Upon achievement of the uniform heating temperature across the surface 22 of the wafer 10, the oxide layer 18 will have a uniform thickness. FIG. 5 illustrates a result of transforming the conductive layer 16 of FIG. 3 into an oxide layer 28 and a conductive layer 27, wherein a heating temperature across the surface 22 of the wafer 10 is about uniform, resulting in the oxide layer 28 having about a uniform thickness t.

Figure 6:
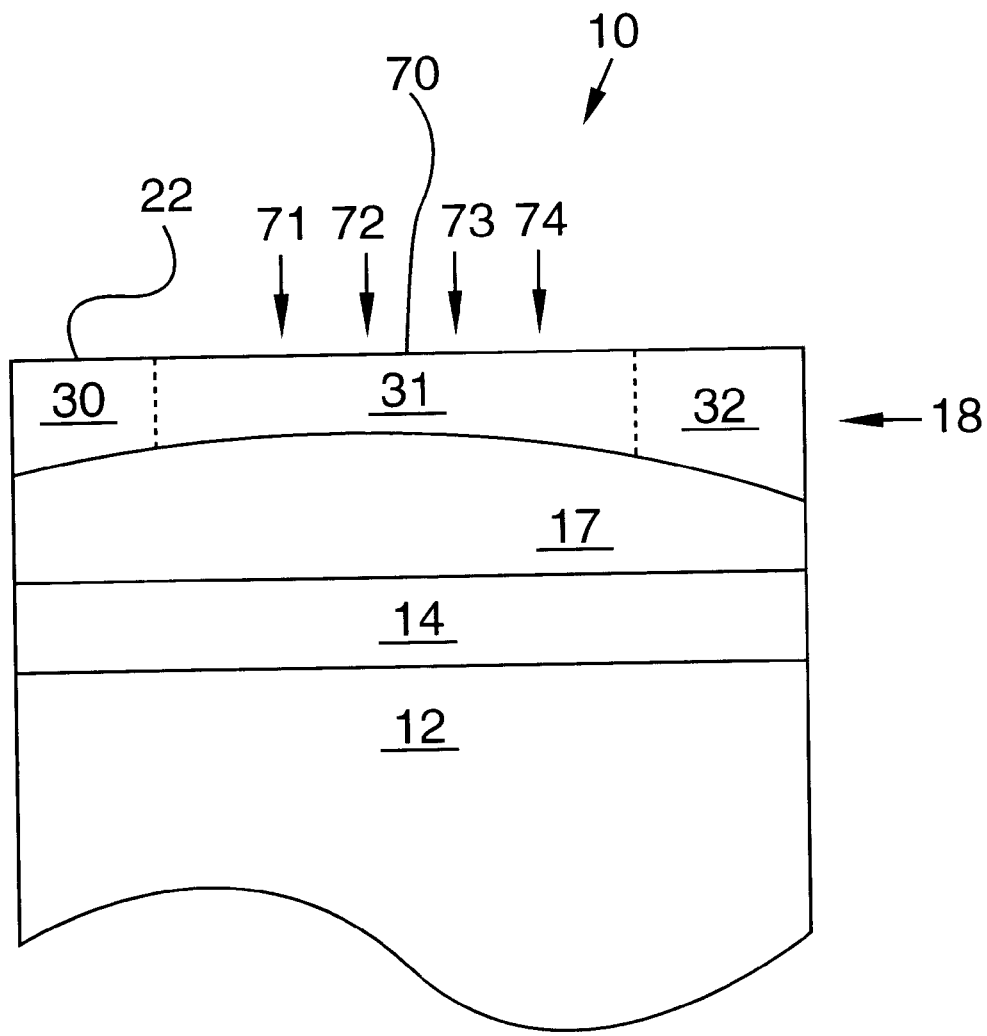
FIG. 6 depicts the wafer of FIG. 4 with a sheet resistance being measured at a point on a wafer surface.

After the step of heating the wafer 10 has terminated, the sheet resistance $R_s$ at spatial points on the wafer 10 is measured by any technique known in the art. As an example, FIG. 6 depicts the wafer 10 of FIG. 4 (or FIG. 5) with a sheet resistance $R_s$, being measured at a point 70 on the surface 22 of the wafer 10, using a known four-probe technique which uses probes 71, 72, 73, and 74, wherein probes 71 and 74 are outer probes, and probes 72 and 73 are inner probes. A voltage $V_1$ is imposed between the outer probes 71 and 74, and a voltage $V_2$ is independently imposed between the inner probes 72 and 73. After the sheet resistances $R_{s1}$ and $R_{s2}$ are determined, respectively, based on measured currents $I_1$ and $I_2$ between the outer probes 71 and 74, and the inner probes 72 and 73, respectively, the sheet resistance at the point 70 is calculated as the arithmetic average of $R_{s1}$ and $R_{s2}$. The resistivity of the remaining conductive layer 17 is negligible in comparison with a resistivity of: the oxide layer 18, the diffusion barrier layer 14, and the substrate 12. The relatively low resistivity of the remaining conductive layer 17 causes the currents ($I_1$ and $I_2$) to flow primarily through the remaining conductive layer 17. Also noting that the substrate 12, the diffusion barrier layer 14, the remaining conductive layer 17, and the oxidize layer 18 are in an electrically parallel combination, and that the electrical current flows primarily through the low-resistance remaining conductive layer 17, the measured sheet resistance $R_s$ of the wafer 10 at the point 70 is a very good approximation to the sheet resistance of the remaining conductive layer 17 associated with the point 70. Note that the oxidize layer 18 is shown in FIG. 6 as comprising regions 30, 31, and 32. A distinction differentiating the regions 30, 31, and 32 will be discussed infra in conjunction with a use of the wafer 10 as a visual monitoring device.

The sheet resistance $R_s$ of the remaining conductive layer 17 at the point 70 is inversely proportional to the thickness of the remaining conductive layer 17, and thus directly proportional to the thickness of the oxide layer 18, at the point 70. Since the thickness of the oxide layer 18 varies directly with the rate of oxidation which in turns increases as the heating temperature increases, the sheet resistance $R_s$ generally increases as the heating temperature increases. Thus the measured spatial variations in sheet resistence $R_s$ across the surface 22 of the wafer 10 reflect corresponding spatial variations in heating temperature across the surface 22 of the wafer 10. Accordingly, the measured distribution of sheet resistance $R_s$ across the surface 22 of the wafer 10 provides guidance as to how the heat source in the heating chamber 50 should be spatially redistributed in order to achieve a greater degree of spatial homogeneity in the sheet resistance $R_s$ across the surface 22 of the wafer 10.

The preceding sequence of the present invention (heating a test wafer, measuring sheet resistance across the wafer, and adjusting the heat source) may be iteratively repeated several times until a sufficiently uniform distribution of sheet resistence $R_s$ is measured using a plurality of temperature monitoring wafers. Any criterion for evaluating spatial uniformity of sheet resistence $R_s$ may be used, such as requiring that a maximum spatial variation, $\Delta R_s$, in measured sheet resistance $R_s$ over the surface 22 of the wafer 10 should be less than a given value. Another criterion for evaluating spatial uniformity of sheet resistence $R_s$ is that a maximum percentage variation, $\Delta R_s/R_s$, in measured sheet resistance $R_s$ over the surface 22 of the wafer 10 be less than a predetermined percentage. Accordingly, the spatial distribution of the heating by the heat source should be adjusted to make $\Delta R_s/R_s$ less than about the predetermined percentage. Thus far, $\Delta R_s/R_s$ of less than 1.06% has been achieved within 9 iterations, using wafers having a silicon substrate, and having a copper conductive layer 16 (see FIG. 3) that includes an initial copper thickness between about 100 Å to about 600 Å. The aforementioned silicon wafers included a diffusion barrier layer 14 of either silicon nitride (with a thickness of about 500 Å) or tantalum pentoxide (with a thickness of about 400 Å), wherein the heating temperature range included 300° C. to 500° C. The lowest value of $\Delta R_s/R_s$ that may be achieved depends on the number of iterations utilized and the sensitivity of $\Delta R_s$ to variations in wafer temperature at a given chamber temperature.

Figure 7:
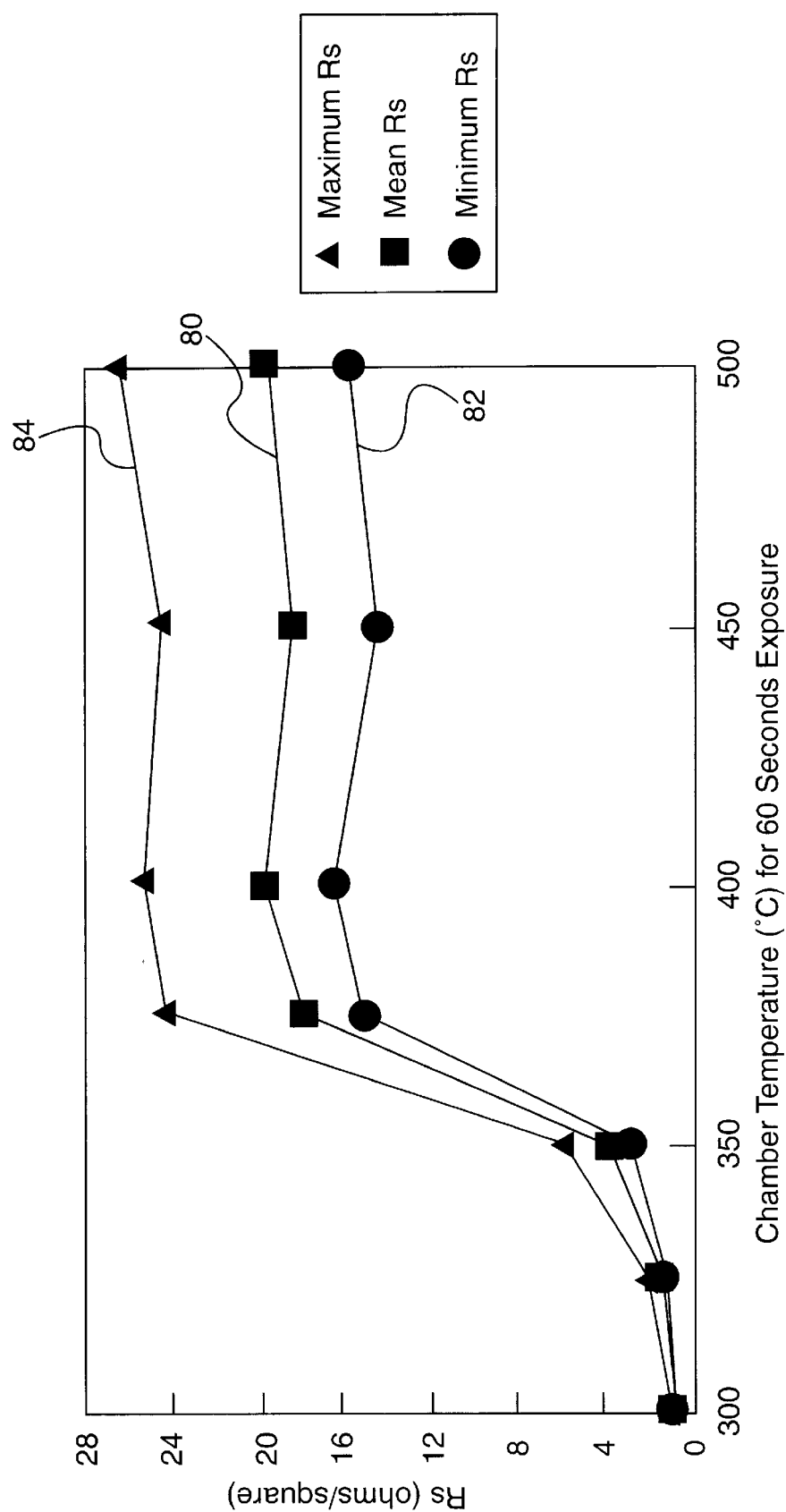
FIG. 7 depicts a plot of sheet resistance of the wafer of FIG. 4 (or FIG. 5) versus chamber temperature.

For a wafer 10 heated for 60 seconds at a temperature in a range of 300° C. to 500° C. in an 100% oxygen ambient environment at 760 Torr partial pressure of oxygen within the heating chamber 50 of FIG. 3, FIG. 7 illustrates a spread in $R_s$ over the surface 22 of the wafer 10. The wafer 10 included a copper conductive layer 16 (see FIG. 3) having about a 600 Å initial thickness, and a $Ta_2N$ diffusion barrier layer 14 of thickness about 400 Å. The resultant oxide layer 18 (see FIG. 4) had a spatially varying thickness due to heating temperature variations on the surface 22 of the wafer 10, as discussed supra. The indicated chamber temperature on the abscissa of FIG. 7 is a measured temperature in the heating chamber 50 at a location in close proximity to the wafer 10. Curves 80, 82, and 84 respectively denote the mean, minimum, and maximum values of sheet resistance $R_s$ at each indicated chamber temperature, with respect to forty-nine (49) spatial points on the surface 22 of the wafer 10 at which the sheet resistance $R_s$ was measured. The mean curve 80 represents the arithmetic average over the 49 spatial points. The spatial point associated with the minimum curve 82 at a particular chamber temperature is not necessarily the same spatial point associated with the minimum curve 82 at another chamber temperature. The spatial point associated with the maximum curve 84 at a particular chamber temperature is not necessarily the same spatial point associated with the maximum curve 84 at another chamber temperature.

A set of curves of the type depicted in FIG. 7 may be generated at the end of each iteration of the method of the present invention, after the sheet resistance $R_s$ is measured at all 49 spatial points. The differential between the maximum curve 84 and the minimum curve 82 reflects the full range in measured sheet resistance $R_s$ variation over 49 spatial points on the surface 22 of the wafer 10 at each chamber temperature. Additionally, the spatial distribution of the sheet resistance $R_s$ may be utilized to adjust the temperature distribution within the heating chamber 50, particularly where the wafer 10 will be placed, by spatially redistributing the heat source within the heating chamber 50 as discussed supra. Adjusting the temperature distribution is for the purpose of performing the next iteration of the process of the present invention, in an effort to narrow the differential between the maximum curve 84 and the minimum curve 82. The preceding steps may be repeated for as many iterations as needed to achieve a desired degree of spacial uniformity of sheet resistance $R_s$. As stated previously, a spatially uniform sheet resistance $R_s$ is indicative of a spatially uniform wafer temperature. Additionally, a spatially tuned distribution of heating, derived as an adjusted heating distribution of a given heating chamber 50 by the method of the present invention, may be used to set an initial heating distribution for heating another wafer in another heating chamber.

The process of the present invention is increasingly effective as the slope of the $R_s$ vs. chamber temperature curve of FIG. 7 increases, since the highest slope portions of the curve occur where $R_s$ is most sensitive to the heating temperature. In FIG. 7, the highest slopes occur for chamber temperature between approximately 325° C. and 360° C., and the corresponding sensitivity is approximately 0.5 ohms per square/° C. Note that the curves in FIG. 7 are temperature insensitive at above 360° C., because at 60 seconds of heating above 360° C. under the given test conditions, essentially all of the copper or conductive material within the conductive layer 16 (see FIG. 3) is converted to the oxide within the oxide layer 18 (see FIG. 4). Thus the heating time period should be less than a heating duration that would be required to oxidize a total thickness of the conductive layer 16. There is also a temperature insensitivity below 330° C. because only a very small portion of the conductive material 16 (see FIG. 3) is oxidized, which results in inconsequential variations in the thickness of the remaining conductive layer 17 (see FIG. 4).

The slope in FIG. 7 could be used to convert a differential in $R_s$ at a given chamber temperature T to a variation $\delta T$ in chamber temperature. Defining $\delta_s$ as the differential in $R_s$ between the maximum curve 84 and the minimum curve 82 at the given temperature T, then $\delta T$ is calculated as $\delta_s/(R_s/dT)$, where $dR_s/dT$ is the slope of the mean curve 80 at the temperature T. $\delta_s$ is calculated by subtracting $R_s$ of the minimum curve 82 from $R_s$ of the maximum curve 84 at the given temperature T. $dR_s/dT$ is calculated by numerical differentiation of the mean curve 80 at the given temperature T.

Several factors affect the shape or magnitude of the curves 80, 82, and 84 of FIG. 7. A first factor is the time of exposure of the wafer 10 to the chamber temperature. As the time of exposure increases, the curves 80, 82, and 84 shift upward as a consequence of the increase in the oxidation layer 18 thickness and the corresponding decrease in the remaining conductive layer 17 thickness (see FIG. 4 or FIG. 5). A second factor is the material selected for the conductive layer 16, which affects the oxidation rate. For example, the oxidation rate is inherently higher for titanium than for copper. Therefore, titanium may be better than copper for use at higher temperatures, and vice versa. A third factor is the thickness of the conductive layer 16. For example, the wafer 10 with a thinner conductive layer 16 (e.g., 100 Å) would be more sensitive at lower temperatures and/or shorter times (e.g., 200° C. for 30 seconds) than with a thicker conductive layer 16 (approximately 1500 Å) at higher temperatures and/or longer times (e.g., 500° C. for 120 seconds).

Although chamber temperatures below 300° C. do not explicitly appear in FIG. 7, it should be noted that data has been collected as low as 200° C., and a high as 600° C. with appropriate choices of conductive material thicknesses, exposure times, etc. These collected data indicate sufficient sensitivity of sheet resistance $R_s$ to temperatures as to render the temperature monitoring associated with the test conditions of FIG. 7 effective in the chamber temperature range of 200° C. to 600° C.

If the temperature distribution across a surface 22 of the wafer 10 is held constant during the time period of heating the conductive layer 16, then a resultant sheet resistance $R_s$ distribution across the surface 22 of the wafer 10 will be invariant to the time duration of the heating, provided that the entire conductive layer 16 has not oxidized. Accordingly, the time duration of heating a production wafer may differ from the time duration of heating the test wafer which was used to set the heating environment for the production wafer.

The monitor of the present invention (i.e., the wafer 10 with the oxide layer 18 in FIG. 4) is reliable, easy to use, and inexpensive to fabricate. Additionally, the monitor is reusable, because the monitor is capable of being reconditioned (i.e., restored to its unoxidized state that existed before the wafer 10 was heated in the heating chamber 50). Reconditioning a monitor (i.e., the oxidized wafer 10) entails converting the oxide layer 18 of the wafer 10 back into the original conductive material by heating the oxidized wafer 10 at an appropriate conversion temperature as is denoted infra. For example, the wafer 10, with the remaining conductive layer 17 comprising copper and the oxide layer 18 comprising cuprous oxide ($Cu_2O$), may be heated in a non-explosive hydrogen ambient environment which may include, inter alia, a "forming gas" of: 10% hydrogen and 90% nitrogen, at atmospheric pressure. Alternatively, the hydrogen ambient environment may include concentrations of hydrogen higher than 10% (up to 100%) at a reduced total pressure as is known by one of ordinary skill in the art to assure that the hydrogen ambient environment is non-explosive. The reconditioning may be performed within a heating chamber such as the heating chamber 50 of FIG. 5 at the conversion temperature of at least about 380° C. for at least about 1 second, and preferably at about 380° C. for about 1 second. Note that the monitor of the present invention could be used to determine and calibrate the conversion temperature, which overcomes an inability of the related art to accurately determine the conversion temperature. The preceding process generates an exothermic reaction which forms copper and water. The water flashes or is evaporated from the surface 22 of the wafer 10, leaving the conductive layer 16 in a pure copper form with no copper oxide. Because the reaction is exothermic, there is (in light of the thinness of the $Cu_2O$ layer) an abrupt transition from the cuprous oxide ($Cu_2O$) to copper (Cu) at a fixed temperature (e.g., about 380° C. or higher), which is independent of the exposure time or thickness of the conductive layer 16. The chemical reaction of the aforementioned reconditioning is:

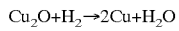
$$Cu_2O+H_2 \rightarrow 2Cu+H_2O$$

Similar reconditioning may be employed for a conductive layer 16 having a conductive material other than copper.

Reconditioning of the conductive layer 16 may be performed at higher temperatures than 380° C. and/or for a longer time than 1 second, which has been found to increase the resistivity of the conductive material. The increased resistivity, which alters the sensitivity and reliability of the monitoring process, is considered due to the diffusion of silicon of the substrate 12 into the conductive layer 16. Therefore, the diffusion barrier 14, which prevents the aforementioned diffusion of silicon, is particularly important in the event the monitor is repeatedly used, such as more than three times.

The temperature monitor (i.e., the wafer 10), as described herein, may also function as a visual monitoring device. In particular, the oxide layer 18 of the wafer 10 can vary in color from a rosy red color to a silver green or silver blue color, depending upon the thickness of the oxide layer 18. For example, annealing the wafer 10 having a copper conductive layer 16 (about 600 Å thick) of in a 100% oxygen ambient environment for about 60 seconds at 300° C. yields a rose color for the oxide layer 18. Annealing the same wafer 10 at 375° C. for 60 seconds yields a silver green color for the oxide layer 18. If during the annealing, the temperature of the wafer 10 varies spatially on the surface 22, there may be a corresponding variation in color at different spatial points associated of the oxide layer 18. For example, since larger oxide thicknesses result from higher heating temperatures, the regions 30 and 32 in FIG. 6 may have a silver green color if the heating temperature at the regions 30 and 32 was at or near 375° C. for 60 seconds, while the regions 30 and 32 in FIG. 6 may have a rose silver if the heating temperature at the region 31 was at or near 300° C. for 60 seconds. Accordingly, the oxide layer 18 of the wafer 10 has a color whose associated wavelength is a function of the thickness of the oxide layer or, equivalently, of the anneal temperature. Therefore, by fixing the anneal time, the color changes of the wafer 10 that results from the annealing may be correlated with the anneal temperature, and thus serve as a method for estimating the anneal temperature. The aforementioned color change methodology is also an alternative to the sheet resistance $R_s$ measurement method, described supra, for determining temperature variations within the heating chamber 50. Note that the sheet resistance $R_s$ measurement method is more sensitive to oxidation thickness and is more quantitative than is the color change method. Following the reconditioning process, the copper conductive layer 16 returns to the original copper color.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A temperature monitoring wafer, comprising:
   a substrate;
   a conductive layer coupled to the substrate, wherein the conductive layer includes a conductive material that will oxidize to form a layer of oxide when the conductive material is at a temperature in a temperature range of about 200° C. to about 600° C. and in an oxidizing environment that comprises an oxidizer of sufficient concentration to oxidize a portion of the conductive layer such that the layer of oxide is formed, and wherein said layer of oxide is utilizable for said temperature monitoring, and wherein a thickness of the oxide layer is nonuniform.

2. The wafer of claim 1, wherein the wafer further comprises a diffusion barrier layer between the substrate and the conductive layer, wherein the diffusion barrier layer inhibits diffusion of the conductive material into the substrate when the wafer is at a first temperature in the temperature range, wherein the diffusion barrier layer inhibits diffusion of material from the substrate into the conductive layer when the wafer is at a second temperature in the temperature range, and wherein the first temperature and the second temperature are equal or unequal.

3. The wafer of claim 2, wherein the diffusion barrier layer includes a diffusion-blocking constituent selected from the group consisting of $Ta_2N$ and $Si_3N_4$.

4. The wafer of claim 2, wherein the diffusion barrier layer has a thickness of at least 20 Å.

5. The wafer of claim 1, wherein the conductive material includes a metal selected from the group consisting of copper aluminum, platinum, tungsten, titanium, and cobalt.

6. The wafer of claim 1, further comprising a heating chamber, wherein the wafer is inside the heating chamber, and wherein an annealing temperature inside the heating chamber is between about 200° C. and about 600° C.

7. The wafer of claim 1, wherein a thickness of the oxide layer is about uniform, when the annealing temperature across the wafer is about uniform.

8. The wafer of claim 1, wherein a thickness of the oxide layer is a function of a temperature to which the wafer has been previously exposed for a fixed period of time, and wherein the temperature to which the wafer has been previously exposed for the fixed period of time is in the temperature range.

9. The wafer of claim 1, wherein the wafer has a color whose associated wavelength is a function of a thickness of the oxide layer.

10. The wafer of claim 1, wherein the wafer has previously included an oxide layer on the conductive layer, said oxide layer including an oxide of the conductive material, wherein the wafer has been previously used for monitoring temperature in the temperature range, and wherein the wafer has been reconditioned for further use such that the wafer does not include the oxide layer.

11. The wafer of claim 1, wherein the conductive layer has been partially oxidized at the temperature in the oxygen atmosphere, and further comprising a system for monitoring the temperature or monitoring spatial variations in the temperature along a surface of the wafer.

12. A temperature monitoring wafer, comprising:

a substrate;

a conductive layer coupled to the substrate, wherein the conductive layer includes a conductive material that will oxide to form a layer of oxide when the conductive material is at a temperature in a temperature range of about 200° C. to about 600° C. and in an oxidizing environment that comprises an oxidizer of sufficient concentration to oxidize a portion of the conductive layer such that the layer of oxide is formed, and wherein said layer of oxide is utilizable for said temperature monitoring, and wherein a sheet resistance of the wafer has a maximum variation of about 1.06% over a surface of the wafer.

13. The wafer of claim 12, wherein the conductive material includes a metal selected from the group consisting of copper, aluminum, platinum, tungsten, titanium, and cobalt.

14. The wafer of claim 12, further comprising a heating chamber, wherein the wafer is inside the beating chamber, and wherein an annealing temperature inside the heating chamber is between about 200° C. and about 600° C.

15. The wafer of claim 12, wherein the wafer further comprises a diffusion barrier layer between the substrate and the conductive layer.

* * * * *